(12) United States Patent
Arp et al.

(10) Patent No.: US 9,306,547 B2
(45) Date of Patent: Apr. 5, 2016

(54) DUTY CYCLE ADJUSTMENT WITH ERROR RESILIENCY

(71) Applicant: International Business Machines Corporation, Armonk, NY (US)

(72) Inventors: Andreas Arp, Nufringen (DE); Fatih Cilek, Boeblingen (DE); Guenther Hutzl, Sindelfingen (DE); Michael Koch, Ehningen (DE); Christian I. Menolfi, Langnau am Albis (CH); Dieter Nissler, Leingelden-Echterdingen (DE); Matthias Ringe, Bonn (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/103,940

(22) Filed: Dec. 12, 2013

(65) Prior Publication Data

US 2015/0171834 A1 Jun. 18, 2015

(51) Int. Cl.
*H03K 3/017* (2006.01)
*H03K 5/04* (2006.01)
*H03K 7/08* (2006.01)
*H03K 5/156* (2006.01)

(52) U.S. Cl.
CPC .............. *H03K 3/017* (2013.01); *H03K 5/1565* (2013.01)

(58) Field of Classification Search
CPC ........ H03K 5/1565; H03K 3/017; H03K 7/08
USPC .................................................. 327/172, 175
See application file for complete search history.

(56) References Cited

U.S. PATENT DOCUMENTS

| | | |
|---|---|---|
| 7,015,739 B2 | 3/2006 | Lee et al. |
| 7,308,632 B1 | 12/2007 | Verma et al. |
| 7,360,135 B2 | 4/2008 | Boerstler et al. |
| 7,612,620 B2 | 11/2009 | Rausch et al. |
| 7,612,622 B2 | 11/2009 | Margittai |
| 7,617,059 B2 | 11/2009 | Boerstler et al. |
| 7,642,863 B2 | 1/2010 | Kaneko et al. |
| 7,646,177 B2 | 1/2010 | Boerstler et al. |
| 7,839,195 B1 | 11/2010 | Feng et al. |
| 7,917,795 B2 | 3/2011 | Boerstler et al. |

(Continued)

FOREIGN PATENT DOCUMENTS

WO  WO 2012177101 A2 * 12/2012

OTHER PUBLICATIONS

Bhatti et al., "Duty Cycle Measurement and Correction Using a Random Sampling Technique", 48th Midwest Symposium on Circuits and Systems, 2005. http://www.isi.edu/~draper/papers/mwscas05_bhatti.pdf.

(Continued)

*Primary Examiner* — Diana J Cheng
(74) *Attorney, Agent, or Firm* — Scully, Scott, Murphy & Presser, P.C.

(57) ABSTRACT

The present disclosure regards adjusting a duty cycle, which includes generating a duty cycle signal having a voltage representing a duty cycle of a clock signal; adjusting a reference voltage generated by an adjustable reference voltage generator to match the duty cycle signal to produce a first matched value; inverting voltage sources of the reference voltage generator; adjusting, while the voltage sources are inverted, the reference voltage to produce a second matched value; and calculating a duty cycle value based on the first and second matched values.

17 Claims, 6 Drawing Sheets

Duty Cycle Circuit

(56) References Cited

U.S. PATENT DOCUMENTS

| | | |
|---|---|---|
| 8,228,105 B2 | 7/2012 | McLeod et al. |
| 2007/0159224 A1 | 7/2007 | Dwarka et al. |
| 2008/0272814 A1 | 11/2008 | Chiang et al. |
| 2009/0128133 A1 | 5/2009 | Boerstler et al. |
| 2012/0280732 A1 | 11/2012 | Roytman et al. |
| 2012/0280733 A1 | 11/2012 | Zhu |
| 2014/0125391 A1* | 5/2014 | Seon .............................. 327/175 |

OTHER PUBLICATIONS

Chow, H., "Duty Cycle Adjusting Circuit for Clock Signals," Proceedings of the 6th WSEAS ICAI'05/MCBC'05/AMTA'05/MCBE'05. Steven's Point, Wisconsin, 2005.

Gentner, T., et al., "Integrated Circuit Failure Prediction Using Clock Duty Cycle Recording and Analysis," U.S. Appl. No. 14/103,958, filed Dec. 12, 2013.

* cited by examiner

FIG. 1 – Duty Cycle Circuit

FIG. 3 – Reference Voltage Generator

| i | $X_{i-1}$ | $2^{n-i}$ | V+ - V- | $X_i$ |
|---|---|---|---|---|
| 1 | - | 32 | (-) | 32 |
| 2 | 32 | 16 | (-) | 48 |
| 3 | 48 | 8 | (-) | 56 |
| 4 | 56 | 4 | (+) | 52 |
| 5 | 52 | 2 | (+) | 50 |
| 6 | 50 | 1 | (-) | 51 |

FIG. 5A – Binary Search Table, $P_{ref} = 0$, $P_{comp} = 0$

FIG. 5B – Binary Search Graph, $P_{ref} = 0$, $P_{comp} = 0$

DUTY CYCLE ADJUSTMENT WITH ERROR RESILIENCY

This disclosure relates to duty cycle adjustment. In particular, it relates to duty cycle adjustment with error resiliency.

BACKGROUND

A clock tree or clock grid may distribute a clock signal to a circuit. Often design requirements such as duty cycle, skew, and slew may not be reached due to design limitations. Additionally, design variations may cause unpredictable inaccuracies and unexpected deviations from these design requirements.

SUMMARY

The present disclosure includes a method for adjusting a duty cycle, comprising generating a duty cycle signal having a voltage representing a duty cycle of a clock signal; adjusting a reference voltage generated by an adjustable reference voltage generator to match the duty cycle signal to produce a first matched value; inverting voltage sources of the reference voltage generator; adjusting, while the voltage sources are inverted, the reference voltage to produce a second matched value; and calculating a duty cycle value based on the first and second matched values.

The present disclosure also includes a system, comprising a clock comparator circuit, a reference voltage generator, and a clock evaluation control circuit. The clock comparator circuit is configured to generate a duty cycle signal having a voltage representing a duty cycle of a clock signal. The reference voltage generator is configured to: generate, in response to a reference control signal, a reference voltage from voltage sources applied to the reference voltage generator, and invert the voltage sources applied to the reference voltage generator in response to a reference polarity signal. The clock evaluation control circuit is configured to: adjust the reference control signal to match the reference voltage to the duty cycle signal to produce a first matched value; adjust, while the voltage sources are inverted, the reference control signal to match the reference voltage to the duty cycle signal to produce a second matched value; and calculate a duty cycle value based on the first and second matched values.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of typical embodiments of the invention and do not limit the invention.

DETAILED DESCRIPTION

Due to manufacturing variations, a clock signal's duty cycle may not be accurate and may require correction. The clock signal may be evaluated and corrected for error in a duty cycle correction circuit. However, the duty cycle correction circuit itself may have manufacturing variations which introduce error into the evaluation and correction of the duty cycle. For example, if a duty cycle is converted into an analog signal, the digital-to-analog converter may have quantization error and resistor variation which may introduce error into the duty cycle evaluation.

According to embodiments of the disclosure, a duty cycle of a clock signal may be evaluated for correction while compensating for circuit errors. A duty cycle of a clock signal is converted to a clock voltage, measured under various circuit configurations, and evaluated for duty cycle correction. The various circuit configurations are designed to generate clock voltage measurements with complementary circuit errors that cancel out when aggregated to produce a more accurate evaluation of the duty cycle. The resulting output of the duty cycle correction circuit may be used to correct the duty cycle of the clock signal.

Figure 1:
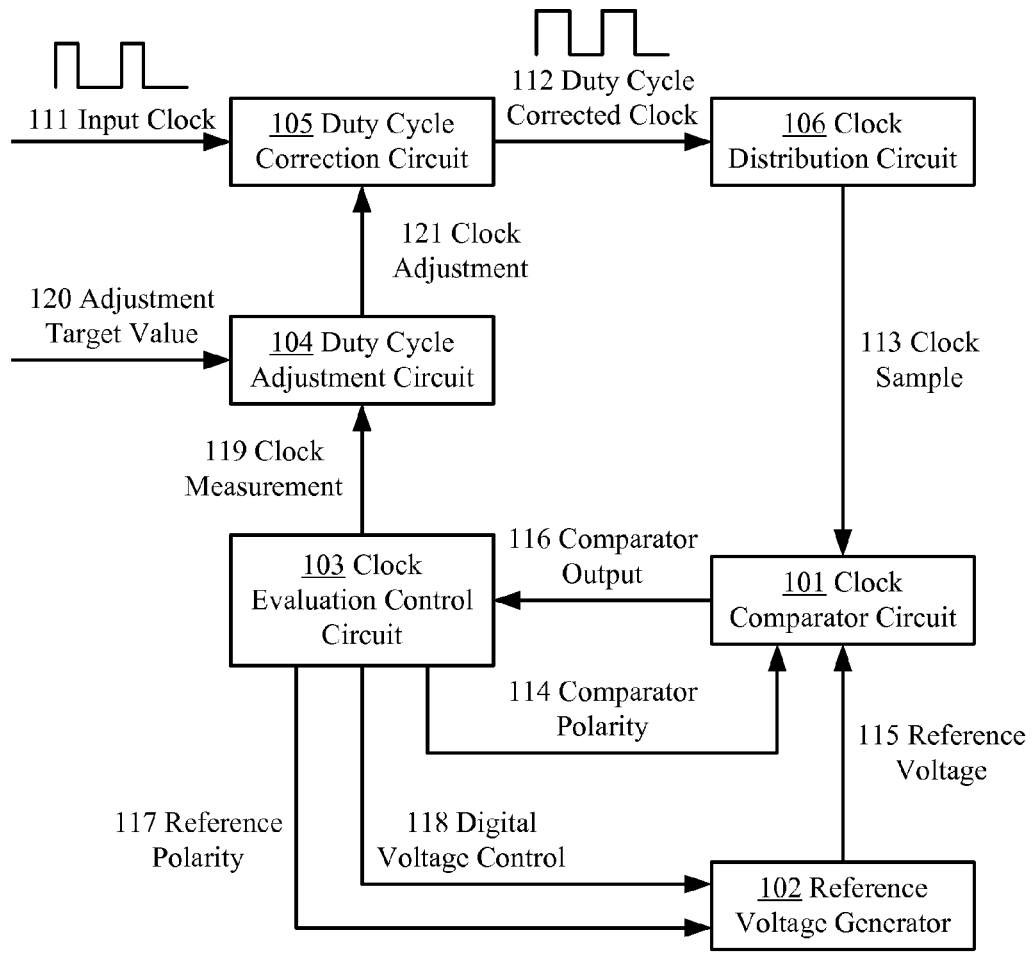
FIG. 1 is a diagram of a duty cycle circuit, according to embodiments of the disclosure.

FIG. 1 is a diagram of a duty cycle circuit, according to embodiments of the disclosure. A clock comparator circuit 101 receives a clock sample 113 from a clock distribution circuit 106. The clock comparator circuit 101 generates an analog clock voltage (or duty cycle signal) from the clock sample 113 that is based on the duty cycle of the clock sample. The clock comparator circuit 101 compares the clock voltage and a reference voltage 115 generated by an adjustable reference voltage generator 102 to produce a digital comparator output 116.

A clock evaluation control circuit 103 can control the reference voltage generator 102 through digital voltage control signals 118. The clock evaluation control circuit 103 evaluates the digital comparator output 116 and modifies the digital voltage control 118 to find a match the between the reference voltage 115 and the clock voltage. The clock evaluation control circuit can also modify a comparator polarity signal 114 and a reference polarity signal 117 to produce multiple phases having different circuit configurations. A phase clock measurement can be produced for each circuit configuration and averaged to approximate a clock measurement value 119.

A duty cycle adjustment circuit can compare the clock measurement value 119 and a target adjustment value 120 to determine whether a duty cycle adjustment is desired. If a duty cycle adjustment is desired, a clock adjustment signal 121 may be sent to a duty cycle correction circuit. The clock adjustment signal 121 modifies an input clock signal 111 to produce a duty cycle corrected clock signal 112.

Clock Distribution Circuit

The clock comparator circuit, reference voltage generator, and comparator evaluation circuit may generate an error-corrected clock measurement from the clock signal through a series of iterations using different circuit configurations. The clock comparator circuit may sample the clock signal at a sample point in the clock distribution circuit. This sample point may be taken from a variety of different locations in the clock distribution circuit. Various types of clock distribution circuits may distribute a clock signal across logic, such as a clock grid or a clock tree.

Clock Comparator Circuit

Figure 2:
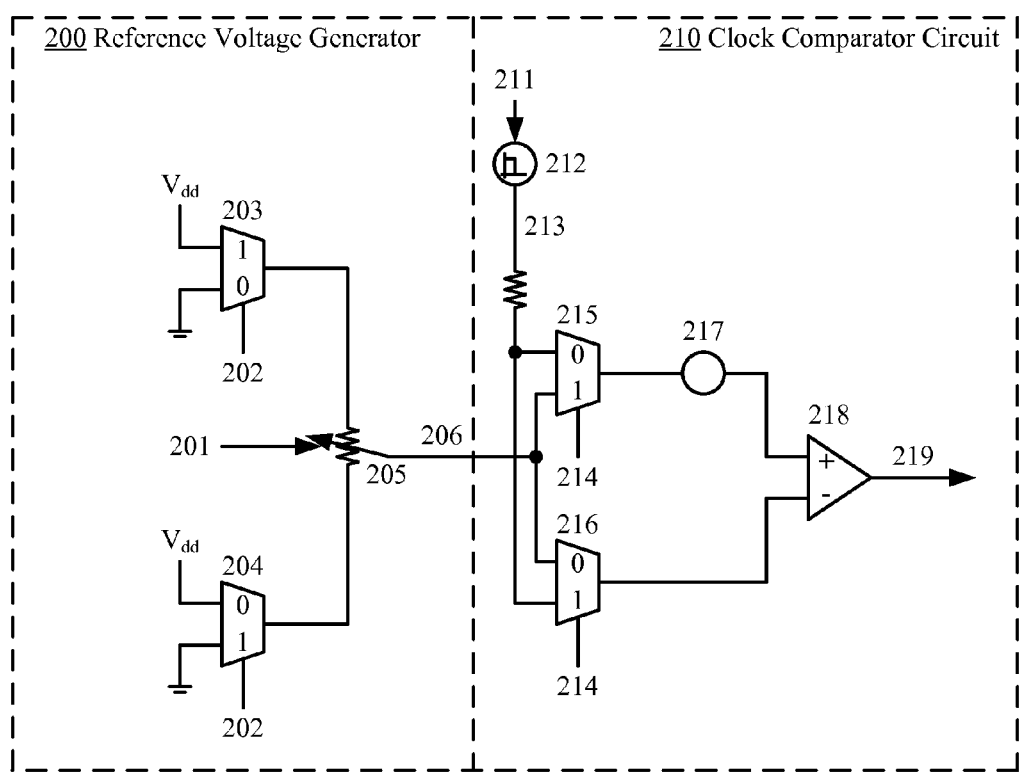
FIG. 2 is a functional diagram of a reference voltage generator and a clock comparator circuit, according to embodiments of the disclosure.

FIG. 2 is a functional diagram of a reference voltage generator 200 and a clock comparator circuit 210, according to embodiments of the disclosure. A low-pass filter 212 generates an analog clock voltage 213 from a clock sample 211. This analog clock voltage 213 may be proportional to the duty cycle from the clock sample 211. The analog clock voltage 213 and a reference voltage 206 each feed into a positive comparator MUX 215 and a negative comparator MUX 216. The positive comparator MUX 215 is connected to the positive terminal of a comparator 218 and the negative comparator MUX 216 is connected to the negative terminal of the comparator 218. The clock comparator circuit 210 may have a voltage offset 217 inherent in the comparator 218, shown here for simplicity as a component connected to the positive terminal of the comparator 218. The comparator 218 evaluates the inputs of its positive and negative terminals and outputs a digital comparator output 219. The positive comparator MUX 215 and negative comparator MUX 216 are both controlled by a comparator polarity signal 214 to invert the inputs into the positive and negative terminals of the comparator 218. This inversion may be used to generate equivalent but opposite error in the clock comparator circuit, such as the voltage offset 217, so that the error may be cancelled out.

Reference Voltage Generator

Still referring to FIG. 2, the reference voltage generator 200 generates the reference voltage 206. A digital voltage control 201 operates a variable resistor network 205. A first MUX 203 and a second MUX 204 are operated by a reference polarity signal and input into the variable resistor network 205 as complements of each other. A reference polarity signal operates the first MUX 203 and the second MUX 204 to invert the voltage supply and drain to each terminal of the reference voltage generator. This inversion may be used to generate equivalent but opposite error in the reference voltage generator, such as resistor variation, so that error may be cancelled out.

Figure 3:
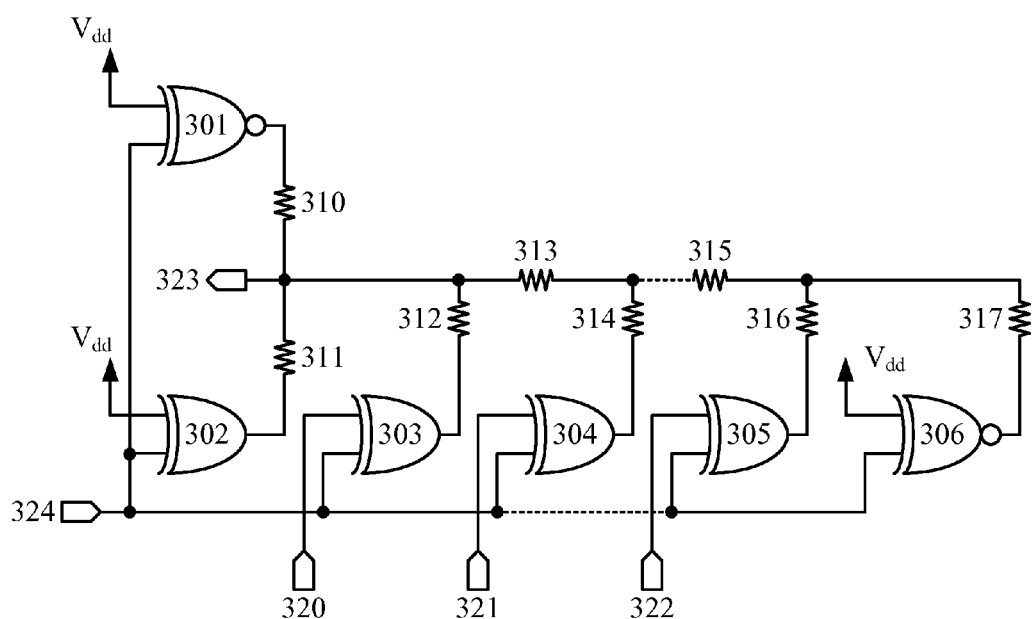
FIG. 3 is a diagram of a reference voltage generator, according to embodiments of the disclosure.

FIG. 3 is a diagram of a reference voltage generator, according to embodiments of the disclosure. A reference voltage 323 is generated linearly from digital voltage control bits 320, 321, and 322 operating stages of an R-2R ladder circuit. Shown here is a three bit reference voltage generator; however, any number of bits may be used, with a corresponding increase in R-2R-XOR stages. In certain embodiments, resistors 313 and 315 can have a value of R, while 312, 314, 316, and 317 can have a value of 2R. Resistors 310 and 311 are voltage divider resistors which may set a voltage range for the reference voltage generator. A reference polarity signal 324 inputs into XOR gates 302, 303, 304, and 305, and inputs into XNOR gates 301 and 306. The reference polarity signal 324 may switch the voltage source and ground of the aforementioned gates 301-306, thereby inverting the operation of the reference voltage generator and any error present in the reference voltage generator.

Clock Evaluation Control Circuit

The clock evaluation control circuit may determine a clock measurement for a clock sample by matching the reference voltage to the clock voltage and generating a clock measurement from the matching operation, according to embodiments of the disclosure. This determination and matching may be performed for multiple circuit configurations to reduce or cancel error. In certain embodiments, the clock evaluation control circuit can be implemented using a variety of processing circuit, logic, communications arrangements, and combinations thereof. Particular implementations use one or more specially configured computer processors that execute instructions to perform one or more of the aspects discussed herein. Various portions can be implemented using discrete or combinatorial logic, analog circuitry, and various forms of computer readable medium.

When the clock evaluation control circuit performs a single clock measurement determination, the clock measurement may not be accurately estimated and error may be introduced into the system. This error may be generated due to factors such as the quantization from analog to digital conversion and the hardware circuitry differences such as manufacturing variations. For example, a comparator may have an offset voltage and a resistor network of a reference voltage generator may have resistor variations. Error may not be eliminated from individual clock measurements due to an inability or impracticality to determine and compensate for a particular error in a measurement.

In certain embodiments of the disclosure, error may be reduced or cancelled out without identifying a particular error. Clock measurements having error may be generated under multiple circuit configurations of the reference voltage generator and the clock comparator circuit. The generated measurements may be summed and complementary error within the multiple measurements may cancel out so that the clock measurement more accurately reflects the clock voltage.

Referring to FIG. 2, the reference voltage generator 200 may be modified with the reference polarity ($P_{ref}$) 202 and the clock comparator circuit 210 may be modified with a comparator polarity ($P_{comp}$) 214. The following table shows the comparator 218 terminal inputs for each circuit configuration:

| Phase | $P_{ref}$ | $P_{comp}$ | V+ | V− |
|---|---|---|---|---|
| 1 | 0 | 0 | $V_{CLK} + V_{OS}$ | $V_{ref,1} = (X_1 * V_{dd}) + V_r$ |
| 2 | 0 | 1 | $V_{ref,2} + V_{OS} = (X_2 * V_{dd}) + V_r + V_{OS}$ | $V_{CLK}$ |
| 3 | 1 | 0 | $V_{CLK} + V_{OS}$ | $V_{ref,3} = (X_3 * V_{dd}) - V_r$ |
| 4 | 1 | 1 | $V_{ref,4} + V_{OS} = (X_4 * V_{dd}) - V_r + V_{OS}$ | $V_{CLK}$ |

In the above table, $V_{CLK}$ represents the clock voltage and $V_{OS}$ represents the voltage offset of the comparator. Each reference voltage ($V_{ref,i}$) produced by the reference voltage generator may be represented as a combination of an ideal reference voltage ($X_i * V_{dd}$) and a reference mismatch error ($V_r$). $V_r$ represents the voltage mismatch error at the largest error contributor in the system, which is the voltage divider consisting of resistor 310 and 311 in FIG. 3. When $P_{ref}$ is inverted, the system creates a complementary reference mismatch error voltage ($V_r$) to that found in phases 1 and 2. Similarly, when $P_{comp}$ is inverted, the inputs to the comparator are inverted, creating complementary voltage offsets $V_{OS}$. $X_{1-4}$ are the phase clock measurements for each configuration phase. Each phase clock measurement may be a binary value of the digital voltage control used to generate the reference voltage.

Figure 4:
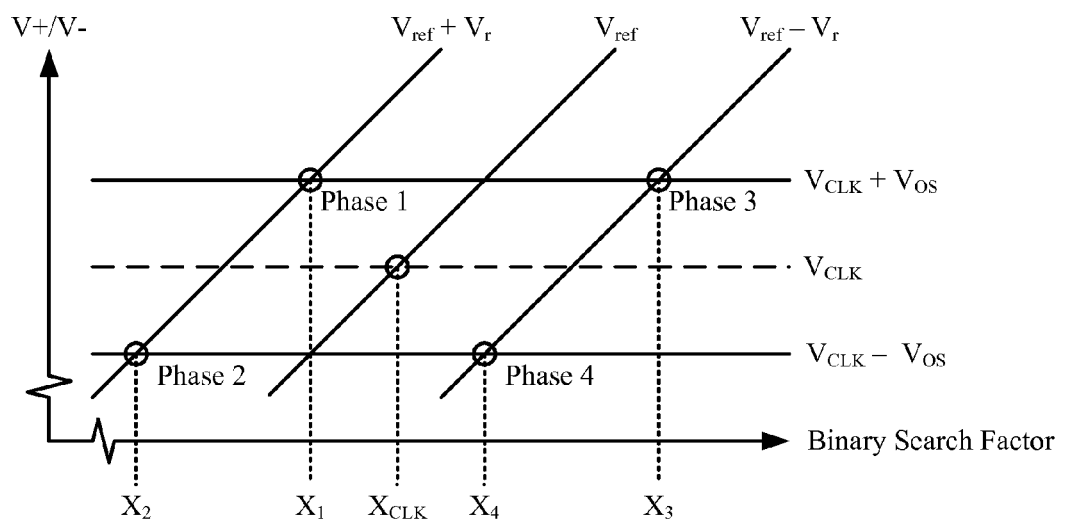
FIG. 4 is a graph of reference voltage measurements for different phases, according to embodiments of the disclosure.

FIG. 4 is a graph of reference voltage measurements for different phases represented by the equations in the table above, according to embodiments of the disclosure. The x-axis (binary search factor) represents the binary search factor for each reference voltage, while the y-axis (V+/V−) represents the voltages on the positive (V+) and negative (V−) terminals of the comparator. The reference voltages generated for two complementary reference voltage generator configurations correspond to lines ($V_{ref} + V_r$) and ($V_{ref} - V_r$), while the clock voltages generated for two complementary comparator configurations correspond to lines ($V_{CLK}+V_{OS}$) and ($V_{CLK}-V_{OS}$). The different phases produce different configurations of the reference voltage mismatch error ($V_r$) and comparator offset ($V_{OS}$). The reference voltage mismatch error and comparator offset may be minimized or cancelled by averaging the four phase clock measurements to estimate the reference voltage ($V_{ref}$) for the clock voltage ($V_{CLK}$, correlated in FIG. 4 to $X_{CLK}$), according to the following equation:

$$V_{CLK}=(X_1+X_2+X_3+X_4)*V_{dd}/4$$

A binary search may be used to match the reference voltage to the clock voltage. A binary search may be performed according to the following equations:

$$\text{If } V_{ref}>V_{CLK}: X_i=X_{i-1}-2^{n-i}$$

$$\text{If } V_{ref}<V_{CLK}: X_i=X_{i-1}+2^{n-i}$$

where $V_{CLK}$ is the voltage at the comparator terminal having the clock voltage, $V_{ref}$ is the voltage at the comparator terminal having the reference voltage, $X_{i-1}$ is the binary search factor of the previous iteration of the binary search, $X_i$ is the binary search factor of the current iteration, and n is the number of digital control bits. As discussed herein, a match between the reference voltage and the clock voltage can include a match that is limited based upon the granularity of the reference voltage generator. For instance, the reference voltage generator can be configured to generate voltages with a 0.1 V granularity. A resulting match can be a reference voltage that is less than 0.1 V of the clock voltage (i.e. within 0.05 V).

Figure 5:
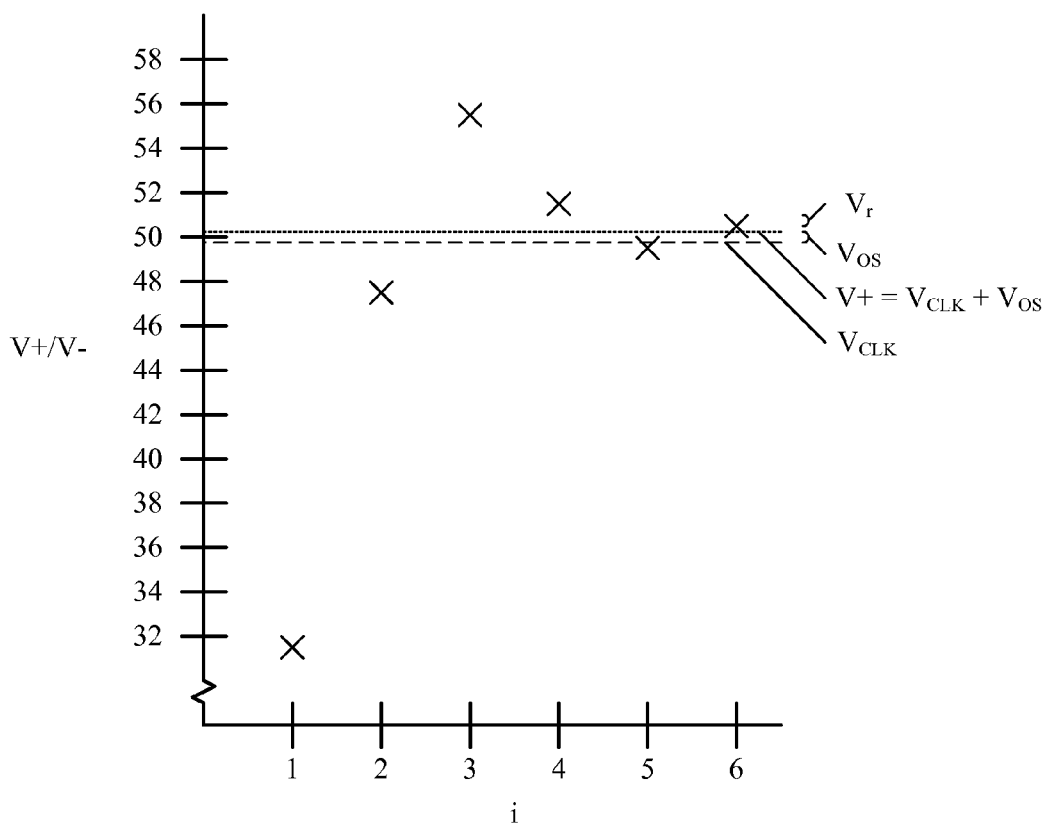
FIG. 5A is an example table of a binary search for the first phase, according to embodiments of the disclosure.
FIG. 5B is an example graph of the binary search data of FIG. 5A, according to embodiments of the disclosure.

FIG. 5A is an example table of a binary search for the first phase discussed above and FIG. 5B is an example graph of the binary search data of FIG. 5A, according to embodiments of the disclosure. The x-axis represents the iteration of the binary search. The y-axis represents the terminal voltage divided by $V_{dd}$. In this example for the first phase, $V_{CLK}$ inputs into the positive terminal of the comparator (V+) and $V_{ref}$ the negative terminal (V−). The V− voltages, represented by "x", are offset from the calculated digital control values of $X_i$ in FIG. 4A due to $V_r$ ($V_{ref,1}=X_1*V_{dd}+V_r$). V+ is also offset from $V_{CLK}$ due to voltage offset $V_{OS}$ (V+=$V_{CLK}+V_{OS}$). As discussed above, these errors and offsets may be cancelled by generating equivalent but opposite errors and offsets through inverting circuitry such as comparator inputs and reference voltage supplies and drains.

Duty Cycle Adjustment Circuit

The clock voltage may be sent to the duty cycle adjustment circuit. The duty cycle adjustment circuit may receive and compare the clock voltage and an adjustment target value. If the clock voltage is within the range of the adjustment target value, the duty cycle adjustment circuit may send no adjustments for the input clock. If the clock voltage is outside the range of the adjustment target value, the duty cycle adjustment circuit may send a clock adjustment signal to a duty cycle correction circuit. The clock adjustment signal may include a signal that is encoded with the duty cycle adjustments for the input clock signal.

Duty Cycle Correction Circuit

The duty cycle correction circuit may correct the duty cycle of an input clock signal. If the duty cycle correction circuit receives a clock adjustment signal containing code from the duty cycle adjustment circuit, the duty correction circuit may decode the clock adjustment from the code and generate a duty cycle corrected clock signal from the input clock and the clock adjustment.

Duty Cycle Correction Process

Figure 6:
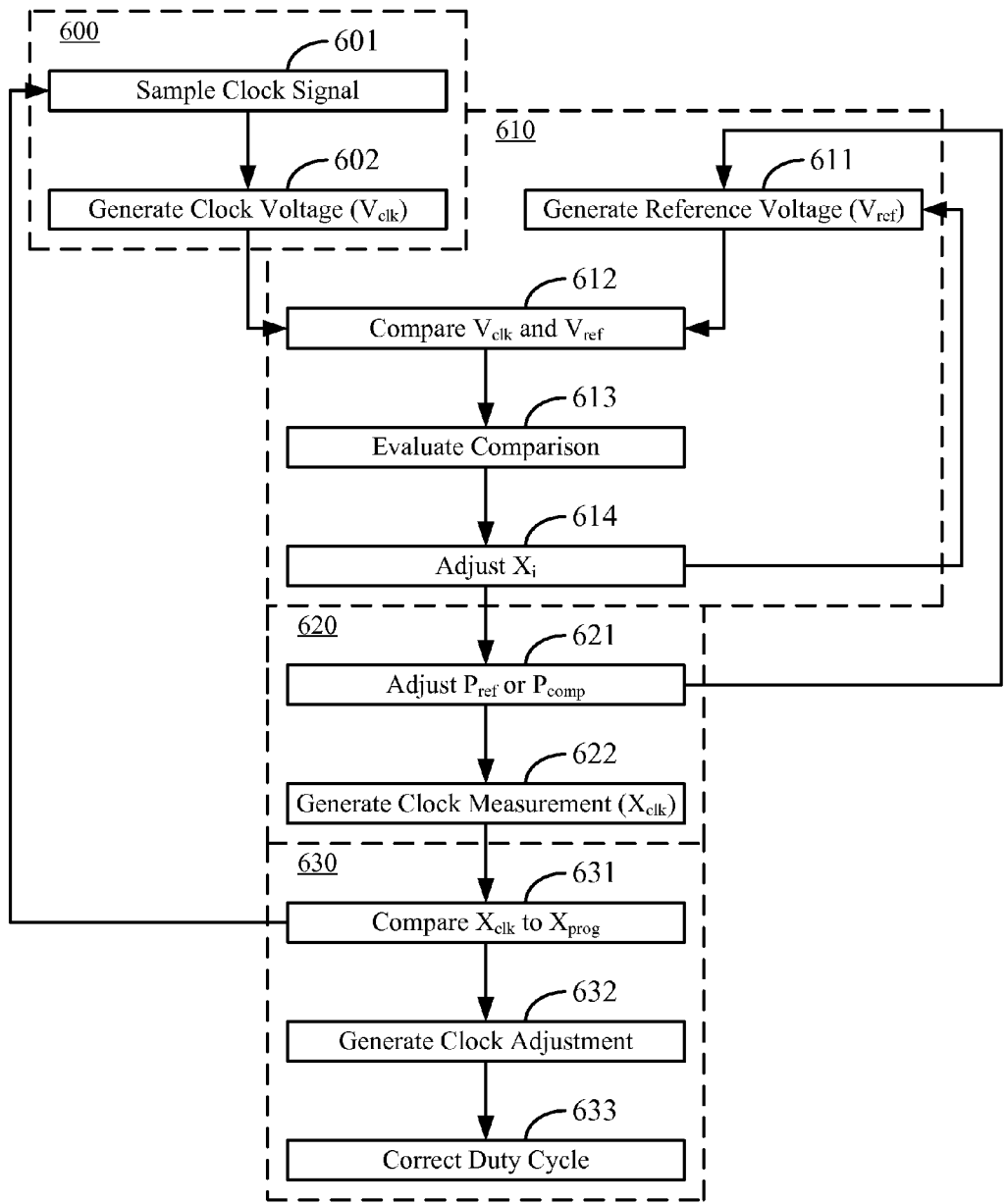
FIG. 6 is a flowchart of a method for correcting a duty cycle of a clock signal, according to embodiments of the disclosure.

FIG. 6 shows a flowchart of a method for correcting a duty cycle of a clock signal, according to embodiments of the disclosure. An analog clock voltage is generated from a clock duty cycle, as in 600. A clock signal may be sampled, as in 601. The duty cycle of the clock signal may be converted to an analog clock voltage, as in 602, such as through a low pass filter.

The value for the clock voltage may be determined using a reference voltage, as in 611. For instance, the clock voltage may be determined by using a binary search to modify the reference voltage. A reference voltage is generated for a first digital control value, as in 611. The reference voltage and clock voltage are compared, as in 612, to produce a comparator output. The comparator output may be evaluated, as in 613, such as though a binary search, and the binary search factor may be adjusted according to the evaluation, as in 614. If the binary search has not run through all its iterations, then the binary search continues by generating a reference voltage, as in 611. If the binary search has run through its iterations, the final binary search factor may be passed on as a phase clock voltage measurement.

A phase clock voltage measurement may be determined for multiple circuit configurations (phases) to generate a clock voltage measurement, as in 620. The reference polarity and comparator polarity may be adjusted, as in 621, to create four different circuit configurations. The binary search of 611 through 614 discussed above may be performed for each circuit configuration. When the phase clock voltage measurements have been determined, they may be averaged to create the clock voltage measurement, as in 622.

A duty cycle may be corrected according to the clock voltage measurement, as in 630. The clock voltage measurement may be compared against a programmable target value, as in 631. If the clock voltage measurement is within a range of the programmable target value, then the duty cycle for the clock signal may not be corrected and another clock signal may be sampled, as in 601. If the clock voltage measurement is outside the range of the target programmable value, a clock adjustment signal may be generated, as in 632. The duty cycle may be corrected according to the clock adjustment signal, as in 633.

Computer Readable Medium

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc. or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although the present disclosure has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the disclosure.

What is claimed is:

1. A method for adjusting a duty cycle, comprising:
   generating a duty cycle signal having a voltage representing a duty cycle of a clock signal;
   generating, using a reference voltage generator, in response to a reference control signal, a reference voltage from voltage sources applied to the reference voltage generator; and
   comparing, using the comparator, the reference voltage and the duty cycle signal;
   adjusting, using a clock evaluation control circuit, the reference voltage generated by the adjustable reference voltage generator to match the duty cycle signal to produce a first matched value;
   inverting supply voltage sources input to the reference voltage generator in response to an applied reference polarity signal;
   adjusting, using the clock evaluation control circuit, while the supply voltage sources are inverted, the reference voltage to match the duty cycle signal to produce a second matched value; and
   swapping comparator inputs into the comparator in response to an applied comparator polarity signal; and
   while the comparator inputs are swapped:
      adjusting, using the clock evaluation control circuit, the reference voltage generated by the adjustable reference voltage generator to match the duty cycle signal to produce a third matched value;
      inverting the supply voltage sources of the reference voltage generator;
      adjusting, using the clock evaluation control circuit, while the supply voltage sources are inverted, the reference voltage to produce a fourth matched value; and calculating a duty cycle value based on the first, second, third, and fourth matched values.

2. The method of claim 1, wherein generating a duty cycle signal further comprises:
sampling the clock signal from a clock distribution circuit; and
generating the duty cycle signal as an analog signal.

3. The method of claim 1, wherein adjusting the reference voltage generated by the adjustable reference voltage generator involves using a binary search to determine the first and second matched values.

4. The method of claim 3, further comprising:
applying the comparator polarity signal and the reference polarity signal to produce multiple clock signal phases representing different circuit configurations,
producing a phase clock measurement for each circuit configuration;
averaging the phase clock measurements to approximate a clock voltage measurement value; and
performing the binary search to match the reference voltage to the clock voltage measurement value.

5. The method of claim 4, further comprising:
performing said binary search by evaluating one of:

$$V_{ref} > V_{CLK}: X_i = X_{i-1} - 2^{n-i}, \text{ or}$$

$$V_{ref} < V_{CLK}: X_i = X_{i-1} + 2^{n-i}$$

where $V_{CLK}$ is the clock voltage measurement value, $V_{ref}$ is the generated reference voltage, $X_{i-1}$ is a binary search factor of a previous iteration of the binary search, $X_i$ is a binary search factor of a current iteration, and n is a number of digital control bits.

6. The method of claim 5, wherein said binary search is an iterative process, said method comprising:
providing a binary search table for each clock signal phase, and using said binary search table to obtain, for each iteration i, values of said binary search factors of said previous and current iterations, and an offset representing a difference of voltages between the comparator inputs, and a value representing a function of said n digital control bits.

7. The method of claim 1, wherein calculating the duty cycle value based on the first and second matched values further comprises averaging the first and second matched values.

8. The method of claim 1, wherein:
the first matched value has a first error value;
the second matched value has a second error value; and
the first error value is approximately equal to an inverse of the second error value.

9. The method of claim 1, further comprising:
comparing the duty cycle value to a programmable target range;
generating code capable of modifying the duty cycle of the clock signal when the duty cycle value is outside the programmable target range.

10. A system, comprising:
a clock comparator circuit configured to:
generate a duty cycle signal having a voltage representing a duty cycle of a clock signal;
a reference voltage generator configured to:
generate, in response to a reference control signal, a reference voltage from supply voltage sources applied to the reference voltage generator; and
invert the supply voltage sources applied to the reference voltage generator in response to an applied reference polarity signal; and
a clock evaluation control circuit configured to:
adjust the reference control signal to match the reference voltage to the duty cycle signal to produce a first matched value;
adjust, while the supply voltage sources are inverted, the reference control signal to match the reference voltage to the duty cycle signal to produce a second matched value, and the clock comparator circuit is further configured to:
compare the reference voltage and the duty cycle signal with a comparator; and
swap comparator inputs into the comparator in response to an applied comparator polarity signal, and
the clock evaluation control circuit is further configured to:
adjust, while the comparator inputs are swapped, the reference voltage generated by the adjustable reference voltage generator to match the duty cycle signal to produce a third matched value;
adjust, while the supply voltage sources and the comparator inputs are swapped, the reference voltage to produce a fourth matched value; and
calculate a duty cycle value based on the first, second, third, and fourth matched values.

11. The system of claim 10, wherein the clock comparator circuit has a low pass filter to generate the duty cycle signal.

12. The system of claim 11, wherein the clock evaluation control circuit is further configured to perform a binary search to adjust the reference voltage to match the duty cycle signal.

13. The system of claim 12, wherein the clock evaluation control circuit is further configured to:
apply the comparator polarity signal and the reference polarity signal to produce multiple clock signal phases representing different circuit configurations,
produce a phase clock measurement for each circuit configuration; and
average the phase clock measurements to approximate a clock voltage measurement value, and
perfrom the binary search to match the reference voltage to the clock voltage measurement value.

14. The system of claim 13, wherein to perform said binary search, said clock evaluation circuit is configured to evaluate one of:

$$V_{ref} > V_{CLK}: X_i = X_{i-1} - 2^{n-i}, \text{ or}$$

$$V_{ref} < V_{CLK}: X_i = X_{i-1} + 2^{n-i}$$

where $V_{CLK}$ is the clock voltage measurement value, $V_{ref}$ is the generated reference voltage, $X_{i-1}$ is a binary search factor of a previous iteration of the binary search, $X_i$ is a binary search factor of a current iteration, and n is a number of digital control bits.

15. The system of claim 14, wherein said binary search is an iterative process, said clock evaluation circuit further comprising:
a binary search table for each clock signal phase, said clock evaluation circuit using said binary search table to obtain, for each iteration i, values of said binary search factors of said previous and current iterations, and an offset representing a difference of voltages between the comparator inputs, and a value representing a function of said n digital control bits.

16. The system of claim 10, wherein the reference voltage generator:
- further comprises an R-2R resistor ladder having a first voltage source and drain and a second voltage source and drain; and
- is further configured to switch between the first voltage source and drain and the second voltage source and drain in response to an inverted reference polarity signal.

17. The system of claim 10, further comprising a clock adjustment circuit configured to:
- compare the duty cycle signal to a programmable target range; and
- generate code capable of modifying the duty cycle of the clock signal when the duty cycle value is outside the programmable target range.

* * * * *